United States Patent
Yamaguchi et al.

(10) Patent No.: US 7,449,670 B2
(45) Date of Patent: Nov. 11, 2008

(54) AMPLIFIER CIRCUIT AND OPTICAL PICKUP DEVICE

(75) Inventors: Hiroshi Yamaguchi, Osaka (JP); Shinichi Miyamoto, Kyoto (JP); Tetsuo Chato, Osaka (JP); Yasufumi Shirakawa, Osaka (JP); Yuzo Shimizu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/687,715

(22) Filed: Mar. 19, 2007

(65) Prior Publication Data

US 2007/0228258 A1    Oct. 4, 2007

(30) Foreign Application Priority Data

Mar. 31, 2006   (JP) .............................. 2006-097024

(51) Int. Cl.
    *H03F 3/08* (2006.01)
(52) U.S. Cl. ..................... 250/214 A; 250/214 LA; 330/308; 330/110
(58) Field of Classification Search ............ 250/214 A, 250/214 LA, 214 R, 214 AG, 214 LS; 330/59, 330/110, 308
See application file for complete search history.

(56) References Cited

U.S. PATENT DOCUMENTS

| | | | |
|---|---|---|---|
| 5,670,775 A * | 9/1997 | Abraham et al. ........ 250/214 A |
| 5,981,936 A | 11/1999 | Fujiie | |
| 2003/0164711 A1 * | 9/2003 | Ishida ..................... 324/610 |
| 2004/0081050 A1 * | 4/2004 | Yamamoto ............... 369/53.26 |
| 2007/0018079 A1 | 1/2007 | Chato et al. | |
| 2007/0075222 A1 | 4/2007 | Fukuda et al. | |
| 2007/0075223 A1 | 4/2007 | Murao et al. | |

FOREIGN PATENT DOCUMENTS

JP   10-256841        9/1998
JP   2003152469 A *  5/2003

OTHER PUBLICATIONS

English Language Abstract of JP 10-256841.
U.S. Appl. No. 11/554,742 to Fukuda et al., filed Oct. 31, 2006.

* cited by examiner

*Primary Examiner*—Kevin Pyo
(74) *Attorney, Agent, or Firm*—Greenblum & Bernstein, P.L.C.

(57) ABSTRACT

An amplifier circuit according to the present invention includes: a first operational amplifier having a negative input terminal, a positive input terminal, and an output terminal; a photodiode connected to the negative input terminal; a first resistor inserted between the output terminal and the negative input terminal; and a second resistor inserted between the output terminal and the positive input terminal, in which the amplifier circuit outputs current from the output terminal via the second resistor.

11 Claims, 9 Drawing Sheets

PRIOR ART

AMPLIFIER CIRCUIT AND OPTICAL PICKUP DEVICE

BACKGROUND OF THE INVENTION (1) Field of the Invention

The present invention relates to an amplifier circuit which amplifies a signal from a photodiode, and an optical pickup device.

(2) Description of the Related Art

An amplifier circuit which amplifies a light-receiving signal from a photodiode that receives reflected light from an optical disc is disclosed in Japanese Laid-Open Patent Application No. 10-256841.

FIG. 1 shows a structure of the photodiode amplifier circuit. The photodiode amplifier circuit includes a photodiode PD, an operational amplifier OP, a feedback resistor R10, and a resistor R11. Cs in the diagram indicates stray capacitance. Light which enters the photodiode PD is converted into current by the photodiode PD. The converted current is inputted to a negative input terminal of the operational amplifier OP. The operational amplifier OP and the feedback resistor R10 operate as a current/voltage amplifier which converts current into voltage.

SUMMARY OF THE INVENTION

However, with the amplifier circuit according to the conventional technology, it is difficult to raise the frequency of light-receiving signals. More specifically, it is difficult to perform high-speed reading/writing from/to Blu-ray Discs (BDs), which is referred to as a next generation DVD. For example, with DVD, when the readout speed is 16×, it is acceptable for the amplifier circuit to respond a frequency of approximately 80 MHz. In contrast, with BD, for example, when the readout speed is 12×, it is required for the amplifier circuit to be able to respond with a frequency of approximately 180 MHz.

FIG. 2 shows gain-frequency characteristic according to the conventional technology. The thin line in the diagram indicates the characteristic when the loop is open, and the heavy line indicates the closed-loop characteristic, which is determined by the feedback resistor R10. In the characteristic shown in the thin line, the frequency characteristic degrades at a pole frequency fp1 due to a phase compensation circuit in the operational amplifier, and at a pole frequency fp2, due to the feedback resistor R10 and the stray capacitance Cs. The pole frequency fp2 is simply determined by a formula $1/(2\pi \cdot R10 \cdot Cs)$.

As a result, when attempting to raise the gain of the operational amplifier OP by simply raising the value of the feedback resistor R10 in order to compensate low sensitivity of photodiode for BD, the pole frequency fp2 shifts to the lower region side, and frequency characteristics in the closed-loop characteristic degrades (band frequency narrows). Thus, it is difficult to increase both gain and frequency.

In addition, a technique is widely known for improving frequency characteristic without decreasing the gain, by lowering the feedback resistor R10 and amplifying the voltage in an amplifier in the next stage so as to even out the total amplification factor in appearance. Although this technique can improve frequency characteristic because the feedback resistor R10 can be reduced, it is inefficient for the noise characteristic. For example, the noise in the case where only the feedback resistor R10 earns gain, in other words, the thermal noise of the feedback resistor R10 is represented as $\sqrt{(4kT \times R10 \times \Delta f)}$. In this formula, k is Boltzmann constant, T is Absolute temperature, R10 is resistance value of R10, and $\Delta f$ is bandwidth. The thermal noise indicates the theoretical limitation of noise in the circuit shown in FIG. 2. However, note that the thermal noise of R11 is not considered. Meanwhile, in the case where the feedback resistor R10 is reduced to half and the current is amplified twice in the amplifier in the next stage, the thermal noise is $(\sqrt{(4kT \times R10/2)}) \times 2 = \sqrt{(4kT \times R10)} \times \sqrt{2}$, which indicates that the thermal noise is $\sqrt{2}$ times greater. As described, the high noise level indicates decreasing S/N ratio (a ratio of signal (S) to noise (N)). For BDs, in which the light-current conversion efficiency of photodiode PD is approximately 70% of the light-current conversion efficiency of DVDs and CDs, this leads to degradation of signal quality.

The present invention has been conceived in view of the aforementioned problem, and has an object to provide an amplifier circuit and optical pickup device which enables expansion of the frequency characteristic to high frequency without degrading the noise characteristic.

In order to solve the aforementioned problem, the amplifier circuit according to the present invention includes a first operational amplifier having a negative input terminal, a positive input terminal, and an output terminal; a photodiode connected to the negative input terminal; a first resistor inserted between the output terminal and the negative input terminal; and a second resistor inserted between the output terminal and the positive input terminal, in which the amplifier circuit outputs current from the output terminal via the second resistor. With this structure, it is possible to expand the frequency characteristic determined by the first resistor and the stray capacitance of the first photodiode to a high frequency, without degrading the noise characteristic.

Here, the amplifier circuit may further include a second operational amplifier and a third resistor, in which the positive input terminal of the first operational amplifier and an input terminal of the second operational amplifier are connected, and the third resistor is inserted between the input terminal of the second operational amplifier and an output terminal of the second operational amplifier. With this structure, it is possible to expand frequency characteristic, without decreasing the gain.

Here, the amplifier circuit may further include a current buffer circuit to which the current outputted from the output terminal of the first operational amplifier via the second resistor is inputted. With this structure, noise propagation from the subsequent stage of the first operational amplifier to the positive input terminal in the first operational amplifier can be shut by including the current buffer circuit, and thus it is possible to output high-quality signals without signal distortion in a wide band range.

Here, the current buffer circuit may have a function for amplifying current. With this structure, by including the current amplifying function in the current buffer circuit, amplification factor of the first operational amplifier determined by the ratio of the first resistance and the second resistance can be lowered, and thus the frequency characteristic can further be improved.

Here, the current buffer circuit may include a bias circuit, which is for setting a bias voltage to an output signal line for outputting current from the output terminal of the first operational amplifier via the second resistor. With this structure, once bias is set to the output signal line, bias of the photodiode can also be set. If the reverse bias of the photodiode is large, the stray capacitance Cs can be reduced, and noise/frequency characteristic can be improved by raising the pole frequency fp2.

Here, the first resistor may include: plural resistance elements; and a first switch circuit which selectively switches one of the resistance elements to be inserted between the output terminal of the first operational amplifier and the negative input terminal of the first operational amplifier. With this structure, in accordance with media with different reflectance, for example, BD-ROM and BD-R, amplification factor of the first operational amplifier, which is determined by the ratio of the first resistor and the second resistor, can be switched.

Here, the first amplifier circuit may further include plural capacitive elements for phase compensation, and the first switch circuit switches one of the capacitive elements in conjunction with the switching of the resistance elements. With this structure, combination of resistance value and capacitive element of the first resistor can be switched, and thus it is possible to obtain a suitable frequency characteristic and prevent oscillation.

Here, the second resistor may include plural resistance elements and a second switch circuit which selectively switches one of the resistance elements to be inserted between the output terminal of the first operational amplifier and the positive input terminal of the first operational amplifier. With this structure, in accordance with media with different reflectance, for example, BD-ROM and BD-R, amplification factor of the first operational amplifier, which is determined by the ratio of the first resistor and the second resistor, may be switched.

Here, the amplifier circuit may further include an output voltage control circuit which prevents a voltage of the output terminal of the first operational amplifier from exceeding a predetermined voltage. With this structure, it is possible to reduce the time for the saturated output signals to return within the dynamic range. To put it differently, in the case where an input signal with wide amplitude, as wide as the dynamic range, enters the negative input terminal, saturation return time, which indicates time from saturation of the internal circuit of the first operational amplifier to the elimination of the saturation, is prolonged. In order to prevent this problem, the output voltage control circuit is included as an amplitude control circuit (clipping circuit) so as to improve the response.

Here, a base current compensation circuit may be included. The base current compensation circuit may be connected to the negative input terminal of the first operational amplifier and the positive input terminal of the first operational amplifier, and compensate base current of input transistors in the first operational amplifier, the input transistors respectively being connected to the negative input terminal of the first operational amplifier and the positive input terminal of the first operational amplifier. With this structure, in the case where the first operational amplifier is configured with a bipolar transistor, base current IB occur in the negative input terminal and the positive input terminal and the base current IB is amplified and outputted, which induces offset voltage. However, the occurrence of the offset voltage can be prevented by including the base current compensation circuit.

In addition, the optical pickup device according to the present invention includes the amplifier circuit, and thus the same operation and effect can be achieved.

In the amplifier circuit according to the present invention, it is possible to expand frequency characteristic to high frequency without degrading noise characteristic, caused by thermal noise of the resistor. It is also effective for expanding the frequency characteristic to high frequency without decreasing the gain. Furthermore, since it is possible to shut noise propagation, high-quality signals without signal distortion can be outputted.

FURTHER INFORMATION ABOUT TECHNICAL BACKGROUND TO THIS APPLICATION

The disclosure of Japanese Patent Application No. 2006-97024 filed on Mar. 31, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

First Embodiment

In the first embodiment, a feedback resistor R1 and a feedback resistor R2 are respectively added to a negative input terminal and a positive input terminal of an operational amplifier. With this structure, an amplification factor and a pole frequency in the frequency characteristic can be arbitrarily determined by a ratio of the two feedback resistors, and a high pole frequency can be realized. In addition, by appropriately selecting the resistance values of the feedback resistor R1 for the negative input terminal and the feedback resistor R2 for the positive input terminal, and the ratio of the two feedback resistors, thermal noise can be kept at a low level.

Figure 3:
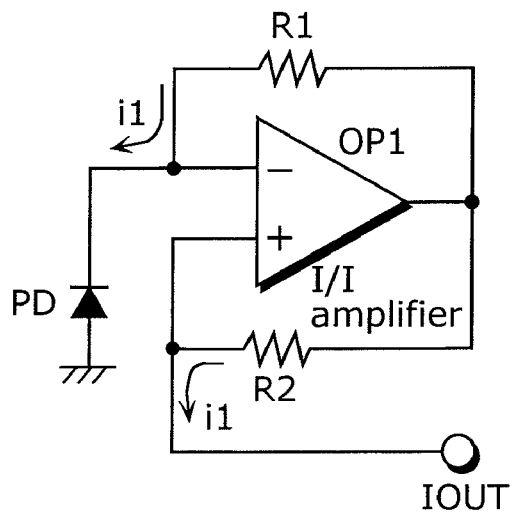
FIG. 3 is a diagram showing an amplifier circuit according to the first embodiment.

FIG. 3 is a diagram showing an amplifier circuit according to the first embodiment. The amplifier circuit in FIG. 3 includes a first operational amplifier OP1, a photodiode PD, a first resistor R1, and a second resistor R2. The first operational amplifier OP1 includes a negative input terminal, a positive input terminal, and an output terminal, and operates as a current amplifier. The photodiode PD receives laser light reflected from an optical disc, and is connected to the negative input terminal. The first resistor R1 is inserted between the output terminal and the negative input terminal. The second resistor R2 is inserted between the output terminal and the positive input terminal. The current amplified by the first operational amplifier OP1, is outputted from a current output terminal IOUT via the second resistor R2. In addition, a stray capacitance Cs exists on the line connecting the cathode of the photodiode PD, the negative input terminal of the first operational amplifier OP1, and an end of the first resistor R1. The capacity of the stray capacitance Cs is approximately a few tenth of pF.

Since it is assumed that the negative input terminal and the positive input terminal of the first operational amplifier OP1 are causing virtual short, i1·R1, which is the voltage at the ends of the first resistor R1 is equal to i2·R2, which is the voltage at the ends of the second resistor R2. Thus, output current from a current output terminal IOUT is i2=(R1/R2)i1. Since the current flowing in the first resistor R1 can be considered as the current of the light-receiving signal indicating amount of light flowing in the photodiode PD, the amplification factor is (R1/R2). For example, in the case where R1=60 kΩ, and R2=2 kΩ, i2=30·i1.

Next, the frequency characteristic of the first operational amplifier OP1 is examined. A pole frequency which is determined by the stray capacitance Cs and the first resistor R1 can be uniquely determined by the ratio of the first resistor R1 to the second resistor R2. Furthermore, the amplification factor is also uniquely determined by the ratio of the first resistor R1 to the second resistor R2. Thus, if the first resistor R1 is set to be smaller value than the conventional technology, the frequency characteristics can be expanded.

In addition, if the first resistor R1 is set to be significantly greater than the second resistor R2, and the amplification factor (R1/R2) is increased, thermal noise of the current from the current output terminal IOUT is mainly determined by the thermal noise of R1, and is represented by $\sqrt{(4kT \times R1 \times \Delta f)}$. In this formula, k is Boltzmann constant, T is Absolute temperature, R1 is resistance value of R1, and $\Delta f$ is bandwidth.

Here, if the first resistor R1 is set to a value smaller than the conventional technology, it is possible to realize both decreasing thermal noise and expanding the frequency characteristic.

Figure 4:
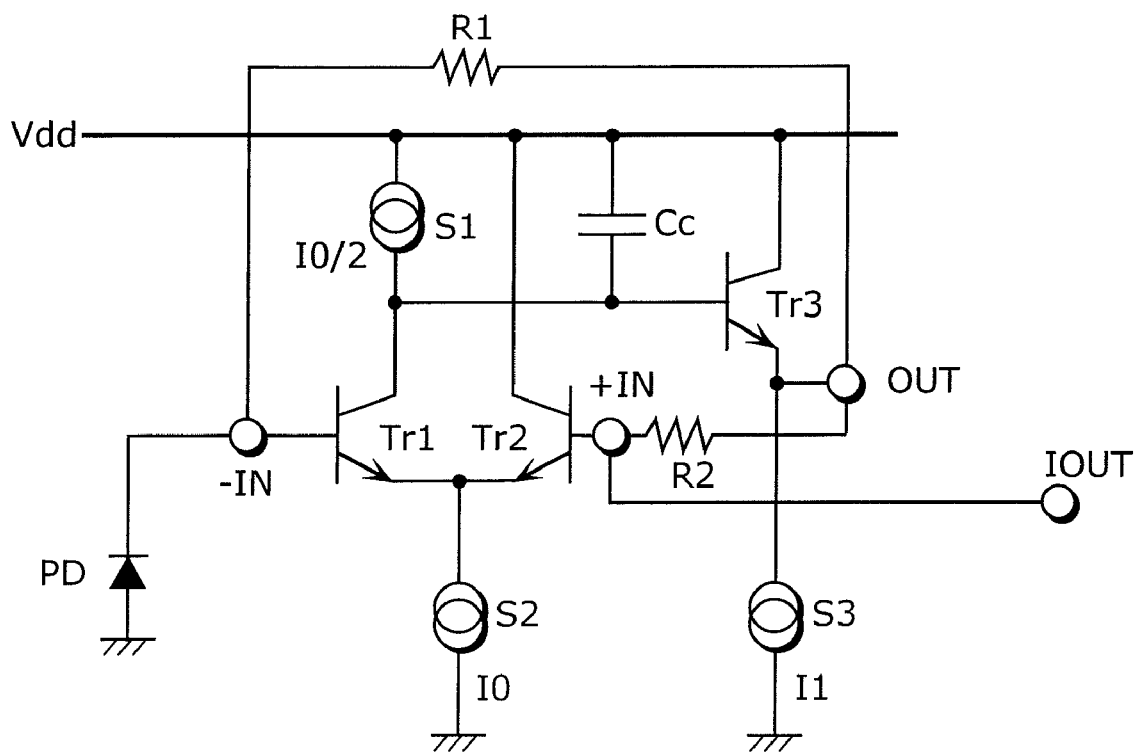
FIG. 4 is a detailed circuit diagram of the amplifier circuit.

FIG. 4 is a detailed equivalent circuit schematic showing the amplifier circuit. In FIG. 4, the negative input terminal, the positive input terminal, and the output terminal of the first operational amplifier OP1 are respectively represented as −IN, +IN, and OUT, and the current output terminal of the amplifier circuit is represented as IOUT. As described in FIG. 4, the first operational amplifier OP1 includes three current sources S1 to S3, transistors Tr1 to Tr3, and a capacitor Cc.

The bases of the transistors Tr1 and Tr2 are respectively connected to the negative input terminal −IN and the positive input terminal +IN, and operate as a differential transistor. The current source S1 supplies current in accordance with the current in −IN to the negative input terminal −IN, however, maintains a half of the current of the current source S2. The capacitor Cc is a capacitor for phase compensation. The transistor Tr3 is for amplification and output.

Figure 5:
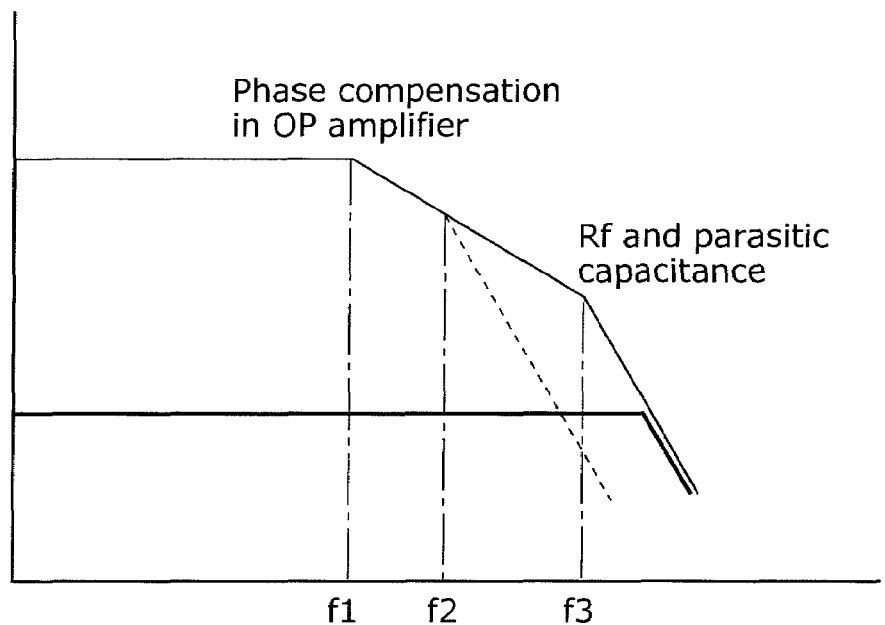
FIG. 5 is a diagram showing gain-frequency characteristic of an amplifier circuit.

FIG. 5 is a diagram showing gain-frequency characteristic of the amplifier circuit. In FIG. 5, the thin line indicates a gain-frequency characteristic when the loop is open, and the heavy line indicates the closed loop characteristic determined by the first resistor R1. In the characteristic shown in the thin line, frequency response degrades at a pole frequency f1 caused by a phase compensation circuit in the operational amplifier, and at a pole frequency f3, caused by the feedback resistor R1 and the stray capacitance Cs. Note that the frequency f2 is indicated for comparison with the conventional technology. As shown in the diagram, if the first resistor R1 is set to be a smaller value than the conventional technology, the frequency characteristic can be expanded. In addition, the gain (amplification factor) can be determined by the ratio of the first resistor R1 to the second resistor R2.

As described above, according to the amplifier circuit of the first embodiment, it is possible to expand the frequency characteristic which is determined by the first resistor R1 and the stray capacitance Cs of the first photodiode to a high frequency.

Second Embodiment

In the second embodiment, an amplifier circuit which enables expansion of the frequency characteristics, while increasing gain at the same time is described. In the first embodiment, since the amplification factor is R1/R2, the amplification factor decreases when R1 is decreased. In order to eliminate the decrease, in the second embodiment, the amplifier circuit includes a second operational amplifier which converts current into voltage and amplifies the converted voltage in the subsequent stage.

Figure 6:
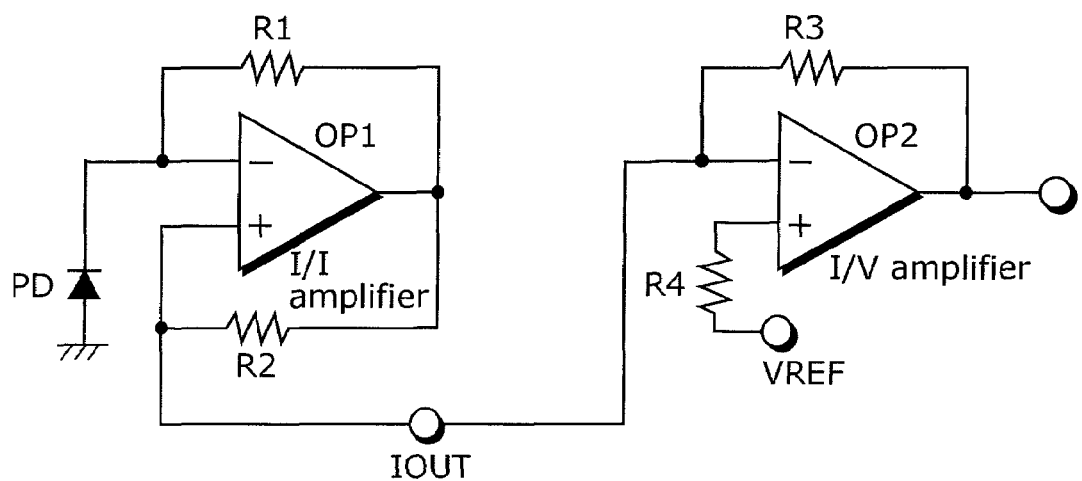
FIG. 6 is a diagram showing an amplifier circuit according to the second embodiment.

FIG. 6 is a diagram showing an amplifier circuit according to the second embodiment. The amplifier circuit in FIG. 6 differs from the amplifier circuit in FIG. 3 in that a second operational amplifier OP2, a third resistor R3, and a resistor R4 are added. Since the same reference numerals are given to the same components, the descriptions for these components are omitted. Description will be made hereinafter with a focus on the differences.

In the second operational amplifier OP2, the third resistor R3 is connected to a negative input terminal as a feedback resistor, and the resistor R4 for inputting reference potential VREF is connected to the positive input terminal. In addition, the negative feedback terminal of the second operational amplifier OP2 is connected to a current output terminal IOUT. With this structure, the second operational amplifier OP2 converts current from the first operational amplifier OP1 in the preceding stage, and amplifies the converted voltage.

As described above, in the amplifier circuit according to the second embodiment, the second operational amplifier converts the signal in which the first operational amplifier performed current amplification into voltage and amplifies the converted voltage, and thus the frequency characteristic can be expanded to a high frequency without decreasing gain.

Figure 1:
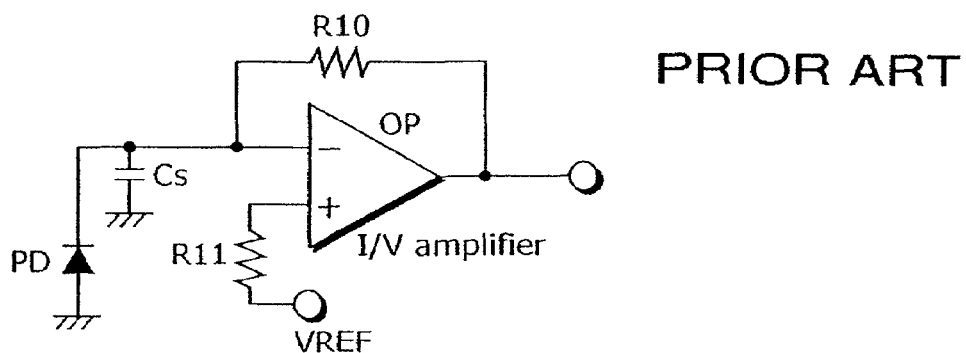
FIG. 1 is a diagram showing an amplifier circuit according to the conventional technology.
Figure 2:
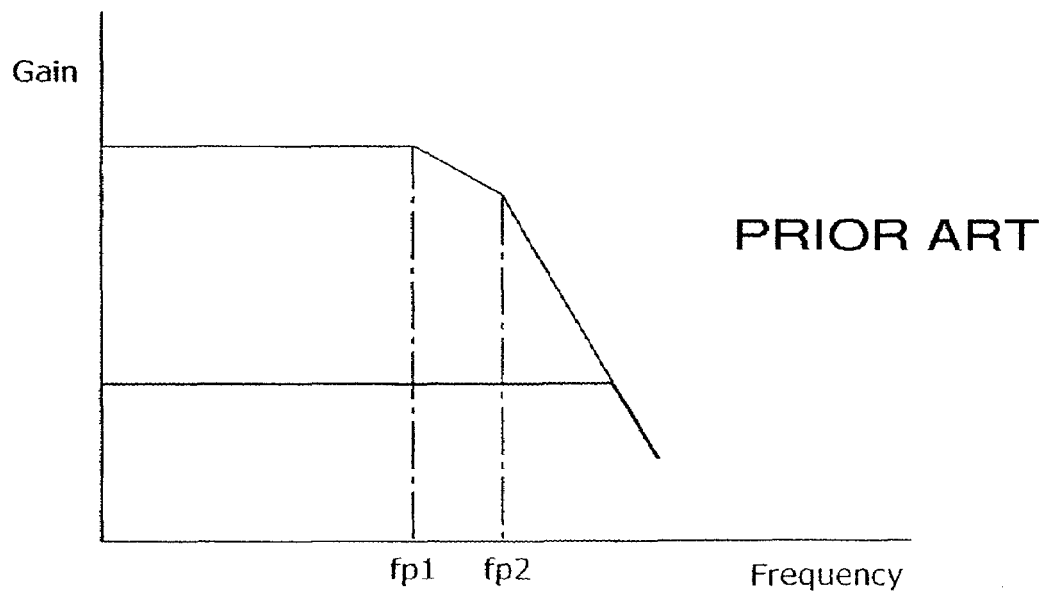
FIG. 2 is a diagram showing gain-frequency characteristic of the amplifier circuit according to the conventional technology.

In addition, the output voltage of the second operational amplifier OP2 is calculated as (R1/R2)×R3. If the first resistance value of the first resistor R1 is set to be a small value while maintaining the amplification factor R1/R2, the thermal noise of output from the second operational amplifier OP2 is approximately represented as $\{\sqrt{(4kT \times R1 \times \Delta f)} \} \times R3$. Therefore, if the first resistor R1, the second resistor R2, and the third resistor R3 are appropriately set, it is possible to reduce thermal noise to a value smaller than the thermal noise that occurs in the feedback resistor R10 in FIG. 1.

Thus, if the first resistor R1 is set to be a small value, it is possible to achieve both reducing thermal noise and raising frequency characteristic.

Third Embodiment

In the present embodiment, an amplifier circuit with improved noise immunity is described. In the second embodiment, there is a possibility of noise propagation which is generated in the second operational amplifier OP2, into the positive input terminal of the first operational amplifier OP1 from the negative input terminal of the second operational amplifier OP2 via the current output terminal IOUT. In the third embodiment, a structure to shut the noise propagation is described.

Figure 7A:
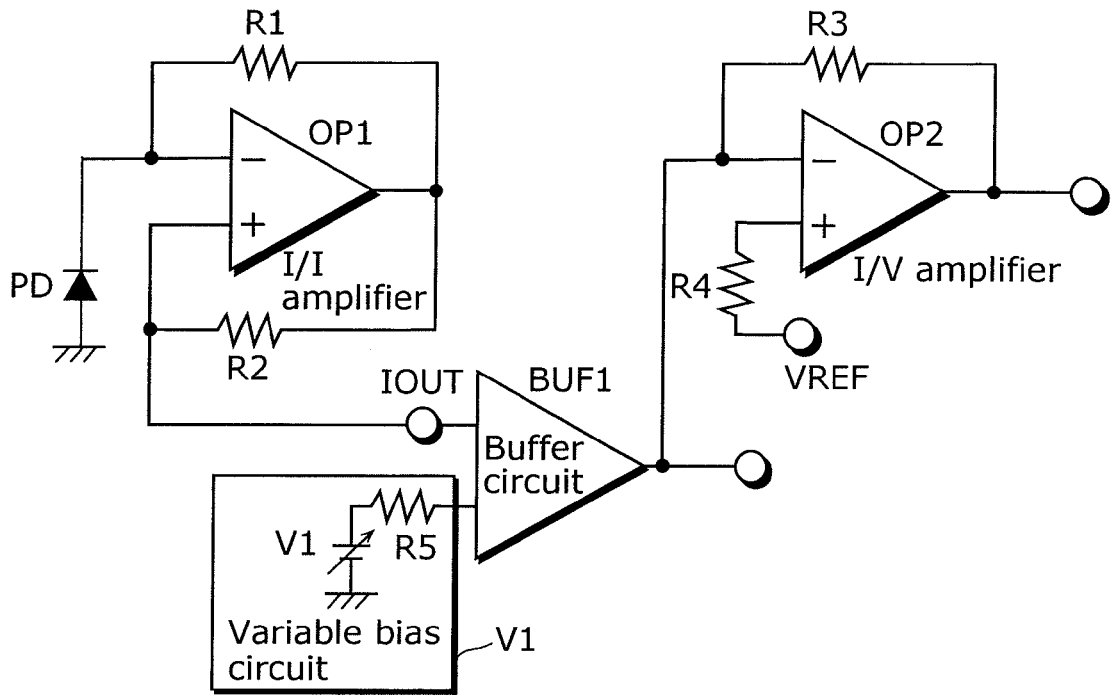
FIG. 7A is a diagram showing an amplifier circuit according to the third embodiment.

FIG. 7A is a diagram showing an amplifier circuit according to the third embodiment. The amplifier circuit in FIG. 7A differs from the amplifier circuit in FIG. 6 in that a buffer circuit BUF 1 and a variable bias circuit V1 are added. Since the same reference numerals are given to the same components, the descriptions for these components are omitted. Description will be made hereinafter with a focus on the difference.

The buffer circuit BUF1 is a circuit which buffers current inputted from the current output terminal IOUT, the current output terminal IOUT is connected to the negative input terminal of the buffer circuit BUF 1. To put it differently, the buffer circuit operates as a buffer which outputs inputted current as a current at an amplification factor of 1 to the negative input terminal of the second operational amplifier OP2.

The variable bias circuit V1 includes a variable DC voltage supply V1 and a resistor R5, and sets a predetermined constant voltage at a positive input terminal of the buffer circuit BUF1.

Figure 7B:
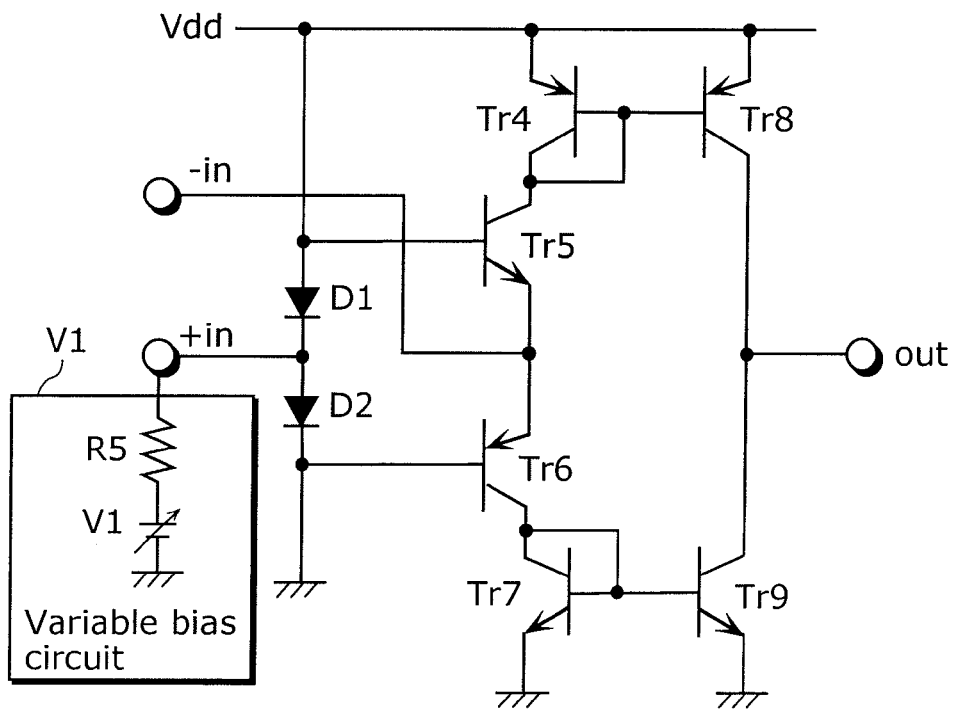
FIG. 7B is a diagram showing a detailed structure of a buffer circuit.

FIG. 7B is a diagram showing a detailed structure of the buffer circuit BUF1. The buffer circuit BUF1 includes two diodes D1 and D2, and transistors Tr4 to Tr9. The two diodes D1 and D2 are serially connected between the power supply and the ground, and the intermediate point is connected to the positive input terminal +in. The ends of the two diodes D1 and D2 are respectively connected to the base of the transistors Tr5 and Tr6. With this structure, the electric potential of the negative input terminal –in, which is connected to the emitter of the transistor Tr5 and the collector of the transistor Tr6 is biased to the constant voltage. The current inputted to the negative input terminal –in is flowed to transistors Tr8 and Tr9 which is a current mirror circuit through push-pull operation of the transistor Tr4 and Tr5, Tr6 and Tr7. This current causes output of current according to the inputted current from the output terminal "out" which is connected to the intermediate point of the transistors Tr8 and Tr9. The output current from the output terminal "out" can be set in a range of the input current to a few times larger than the inputted current by setting the amount of the current in the current mirror.

As described above, according to the amplifier circuit of the third embodiment, by inserting the buffer circuit BUF1 which is for buffering current between the first operational amplifier OP1 and the second operational amplifier OP2, noise propagation to the positive input terminal of the first operational amplifier can be shut. Thus, it is possible to output high-quality signals without signal distortion in a wide range. In addition, since the bias voltage is variable, a bias voltage suitable for shutting noise is set in accordance with the output current from the first operational amplifier OP1.

Fourth Embodiment

In the fourth embodiment, an amplifier circuit which is capable of switching the amplification factor of the first operational amplifier OP1 is described. Although in the first embodiment, the amplification factor of the second operational amplifier OP2 is a fixed value determined by (R1/R2), a structure which enables switching amplification factor is described in the fourth embodiment.

Figure 8:
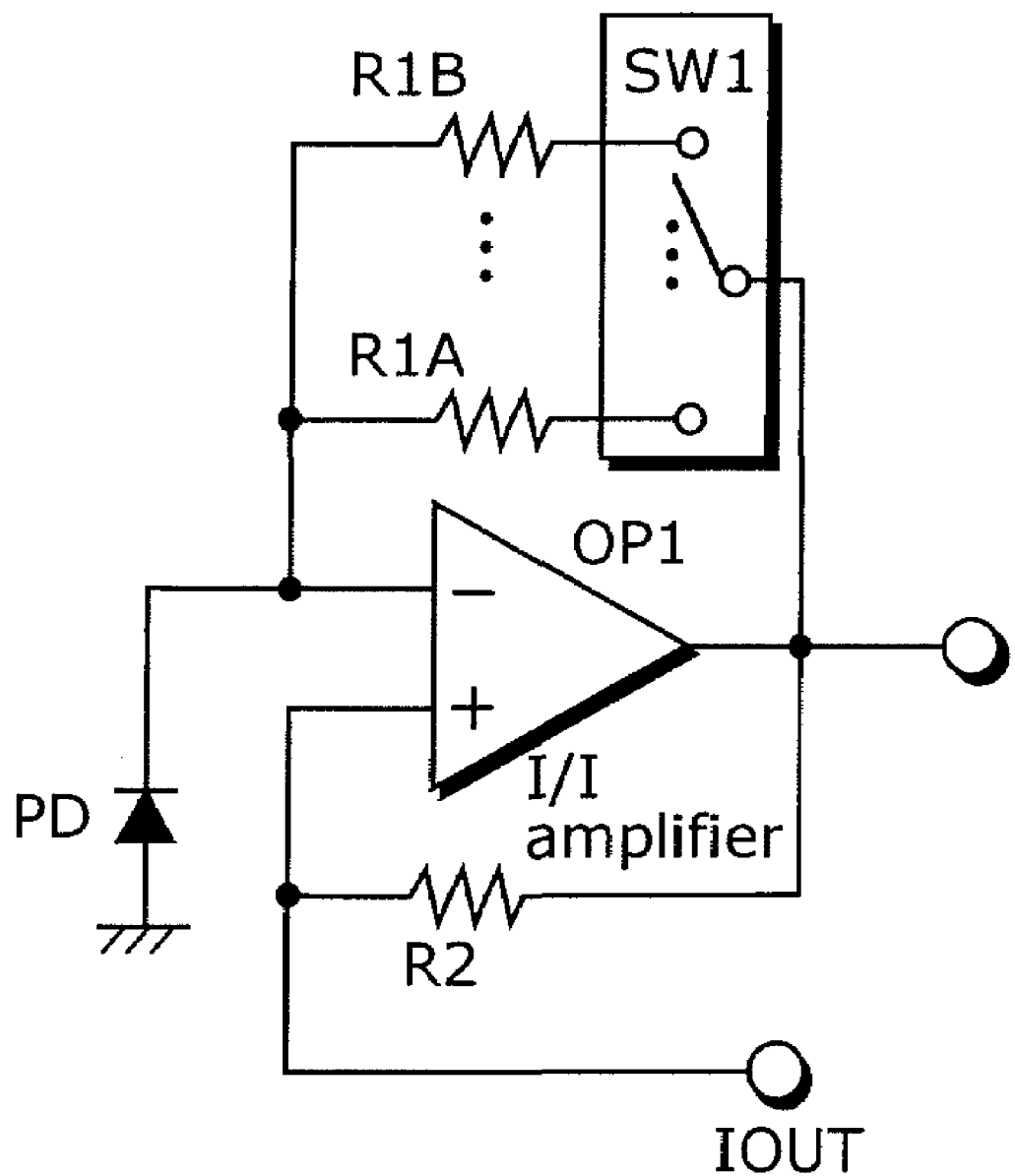
FIG. 8 is a diagram showing an amplifier circuit according to the fourth embodiment.

FIG. 8 is a diagram showing an amplifier circuit according to the fourth embodiment. FIG. 8 differs from FIG. 3 in that the amplifier circuit includes plural resistance elements R1A . . . R1B instead of the first resistor R1 and a first switch circuit SW1. Since the same reference numerals are given to the same components, the descriptions for these components are omitted. Description will be made hereinafter with a focus on the difference.

The plural resistance elements R1A . . . R1B respectively have different resistance values.

The first switch circuit SW1 selectively switches one of the resistance elements to be inserted between the output terminal OUT of the first operational amplifier OP1 and the negative input terminal –IN of the first operational amplifier OP1. Here, any one of the resistance elements R1A . . . R1B is selected.

According to the amplifier circuit in the fourth embodiment, the amplification factor of the first operational amplifier OP1 is determined by a ratio of the selected resistance element to the second resistor R2. Thus, the first switch circuit SW1 can switch the amplification factors, for example, in accordance with reading speed and writing speed (i.e. 1×, 2× . . . 16×, and so on) of an optical disc drive in which the amplifier circuit is equipped. In addition, the amplification factors may be switched for reading and writing even when the speed is same. Furthermore, the amplification factors may be switched according to media with different reflectance such as BD-ROM and BD-R.

Note that the first switch circuit SW1 may select a given combination from the plural resistor elements R1A . . . R1B.

Fifth Embodiment

In the fifth embodiment, an amplifier circuit which is capable of switching phase compensation characteristics is described. In the fourth embodiment, when switching amplification factors, the characteristic of phase compensation by a phase compensation circuit (compensation method by capacitor Cc for compensation shown in FIG. 4) in the first operational amplifier OP1 may differ, and in the worst case, the output of the operational amplifier OP1 may cause an oscillation. In the fifth embodiment, a structure for switching capacitance values of capacitors for phase compensation in conjunction with switching amplification factors by incorporating a variable capacitor for capacitance used for phase compensation is described.

Figure 9:
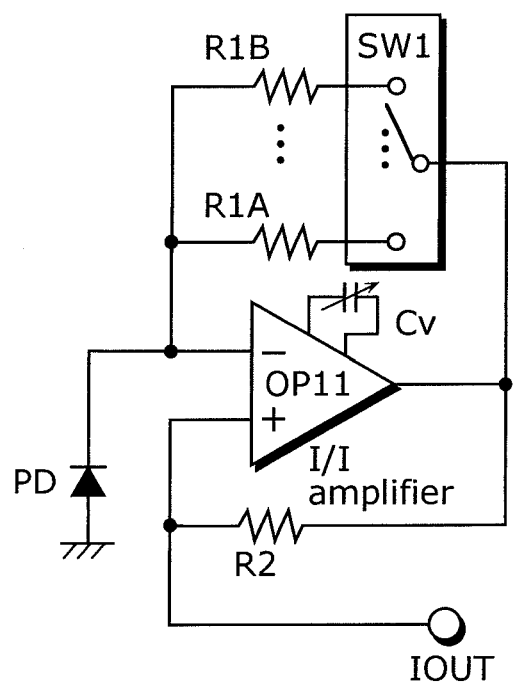
FIG. 9 is a diagram showing an amplifier circuit according to the fifth embodiment.

FIG. 9 is a diagram showing an amplifier circuit according to the fifth embodiment. FIG. 9 differs from FIG. 8 in that the amplifier circuit includes a first operational amplifier OP11 instead of the first operational amplifier OP1. The first operational amplifier OP11 differs from the first operational amplifier OP1 in that the first operational amplifier OP11 includes a variable capacitor Cv instead of a capacitor Cc with a fixed capacitance value. Since the same reference numerals are given to the same components, the descriptions for these components are omitted. Description will be made hereinafter with a focus on the difference.

The variable capacitor Cv is a capacitance for phase compensation, and is variable to a given capacitance value.

Figure 10:
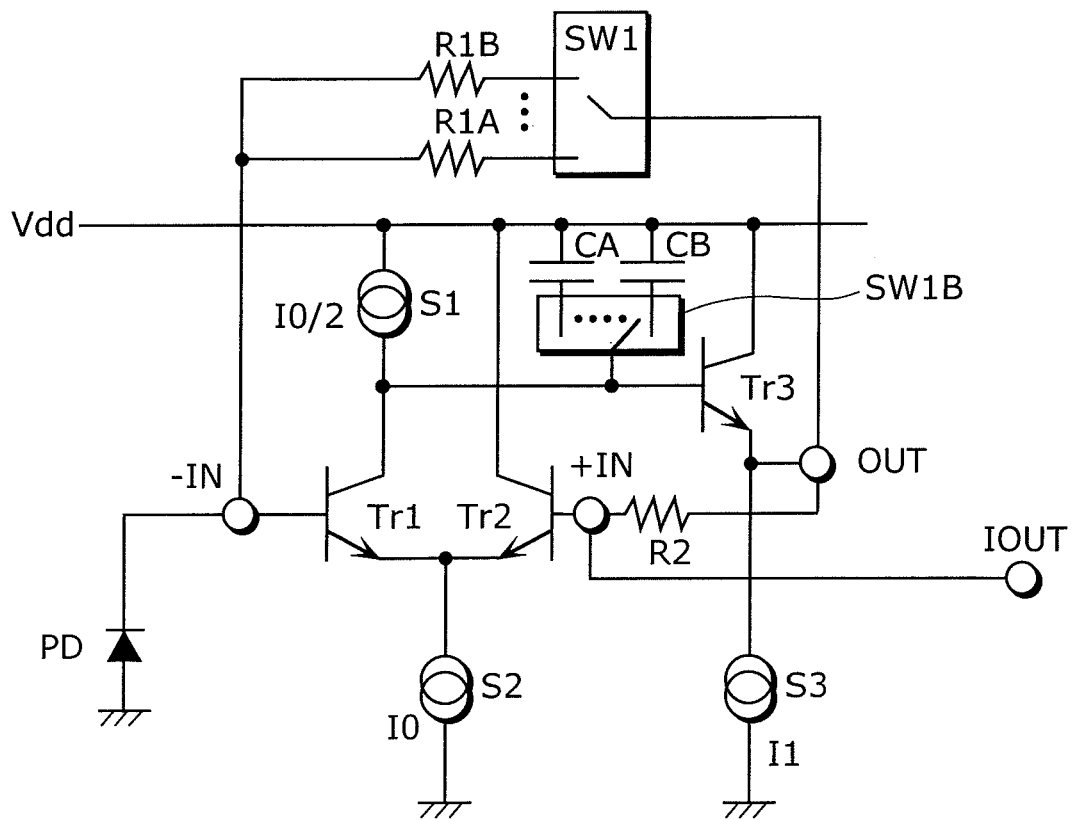
FIG. 10 is a diagram showing a detailed structure of an operational amplifier.

FIG. 10 is a diagram showing an example of detailed structure of the amplifier circuit according to the fifth embodiment. FIG. 10 differs from FIG. 4 in that the amplifier circuit includes plural resistance elements R1A . . . R1B instead of the first resistor R1, the first switch circuit SW1, plural capacitive elements CA . . . CB instead of the capacitor Cc, and a switch circuit SW1B.

The plural resistance elements R1A . . . R1B and the first switch circuit SW1 are omitted since the same components are described in the fourth embodiment.

Each of the capacitive elements CA . . . CB has a different capacitance value.

The switch circuit SW1B selectively switches one of capacitive elements to be inserted between the base of the output transistor Tr3 and a power line Vdd. Here, any one of the capacitive element R1A . . . R1B is selected.

In the amplifier circuit according to the fifth embodiment, the phase compensation characteristics of the first amplifier OP11 is determined by the capacitance value of the selected capacitive element. Thus, the switch circuit SW1B can switch appropriate phase compensation characteristics in conjunction with the switching of amplification factors.

Note that the first switch circuit SW1B may select a given combination of the plural capacitive elements CA . . . CB. In addition, the switch circuit SW1B may be independently switched without linking with the first switch circuit SW1.

Sixth Embodiment

In the sixth embodiment, an amplifier circuit which is further capable of switching the amplification factor of the first operational amplifier OP1. Although in the first embodiment, the amplification factor of the second operational amplifier OP2 is a fixed value determined by (R1/R2), a structure which enables switching amplification factor is described in the sixth embodiment.

Figure 11:
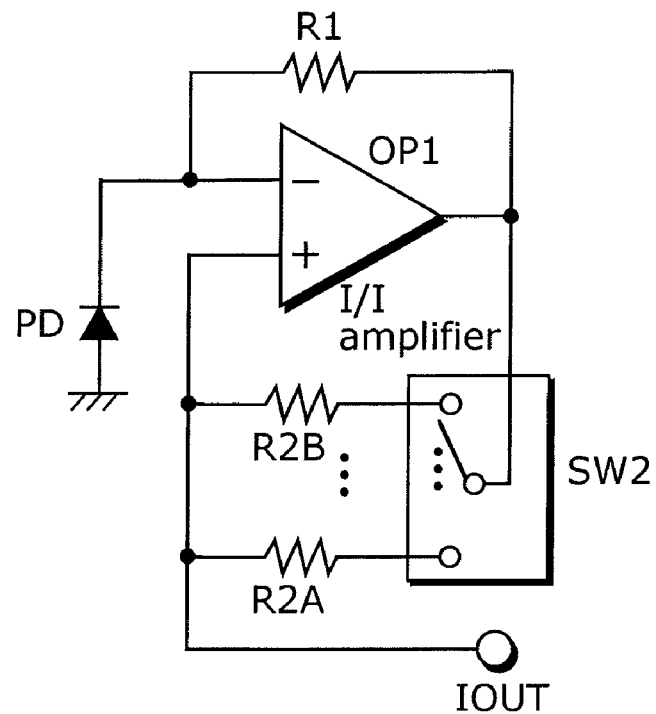
FIG. 11 is a diagram showing an amplifier circuit according to the sixth embodiment.

FIG. 11 is a diagram showing an amplifier circuit according to the sixth embodiment. FIG. 11 differs from FIG. 3 in that the amplifier circuit includes plural resistance elements R2A . . . R2B instead of the second resistor R2 and a second switch circuit SW2. Since the same reference numerals are given to the same components, the descriptions for these components are omitted. Description will be made hereinafter with a focus on the difference.

The plural resistance elements R2A . . . R2B respectively have different resistance values.

The second switch circuit SW2 selectively switches one of the resistance elements to be inserted between the output terminal OUT of the first operational amplifier OP1 and the positive input terminal +IN of the first operational amplifier OP1. Here, any one of the resistance elements R2A . . . R2B is selected.

In the amplifier circuit according to the sixth embodiment, the amplification factor of the first amplifier OP1 is determined by the ratio of the selected capacitive element to the second resistor R2. Thus, the second switch circuit SW2 can switch the amplification factor. The amplification factor, for example, can be switched in accordance with reading speed and writing speed (i.e. 1×, 2× . . . 16×, and so on) of an optical disc drive in which the amplifier circuit is equipped. In addition, the amplification factor may be switched for reading and writing when the speed is same.

Note that the second switch circuit SW2 may select a given combination from the plural resistor elements R2A . . . R2B.

Seventh Embodiment

In the seventh embodiment, a structure in which the photodiode PD is connected to the operational amplifier OP1 with a common cathode is described.

Figure 12:
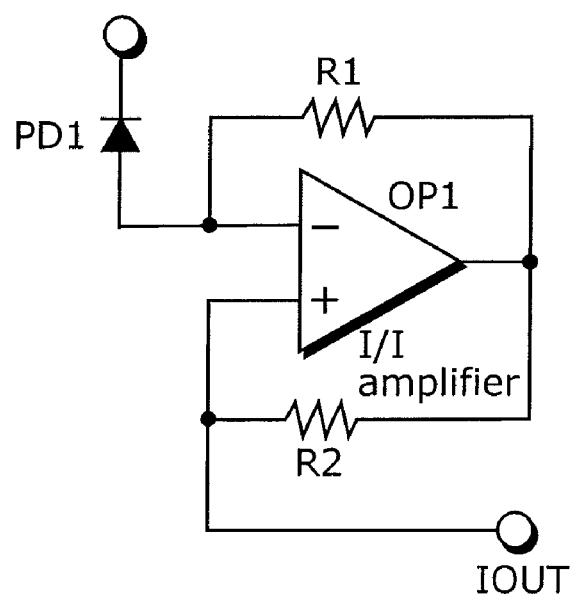
FIG. 12 is a diagram showing an amplifier circuit according to the sixth embodiment.

FIG. 12 is a diagram showing an amplifier circuit according to the seventh embodiment. FIG. 12 differs from FIG. 3 in that the amplifier circuit includes a photodiode PD1 instead of the photodiode PD. Since the same reference numerals are given to the same components, the descriptions for these components are omitted. Description will be made hereinafter with a focus on the difference.

The cathode of the photodiode PD1 is connected to the negative input terminal −IN of the first operational amplifier OP1, and the anode of the photodiode PD1 is connected to a common line such as a power line Vdd.

The photodiode may be with a common cathode as described in the seventh embodiment, or may be with a common anode as described in other embodiments.

Eighth Embodiment

In the eighth embodiment, an amplifier circuit which is capable of switching photodiodes connected to the first operational amplifier OP1 is described.

Figure 13:
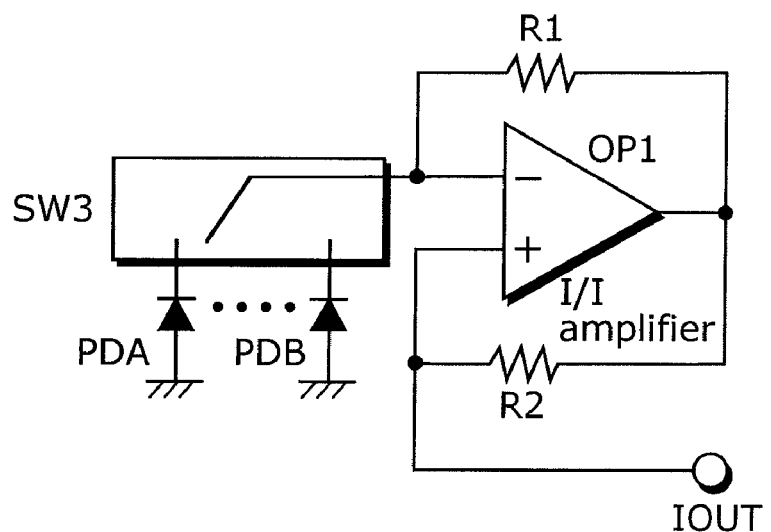
FIG. 13 is a diagram showing an amplifier circuit according to the eighth embodiment.

FIG. 13 is a diagram showing an amplifier circuit according to the eighth embodiment. FIG. 13 differs from FIG. 3 in that the amplifier circuit includes photodiodes PDA . . . to PDB instead of the photodiode PD, and a third switch circuit SW3. Since the same reference numerals are given to the same components, the descriptions for these components are omitted. Description will be made hereinafter with a focus on the difference.

Plural photodiodes PDA . . . PDB receive laser light at different wavelengths. Furthermore, the amplifier circuit may include photodiodes of same wavelength and of different sensitivity.

The third switch circuit SW3 selectively switches the photodiodes to be connected to the negative input terminal −IN of the first operational amplifier. Here, any one of the photodiodes PDA . . . PDB is selected.

In the amplifier circuit according to the eighth embodiment, it is possible to switch to the most suitable photodiode, for example, in accordance with the media (BD-ROM, BD-R and the like) of different reflectance. In addition, in accordance to the type of optical disc, it is also possible to switch to the most suitable photodiode. Therefore, this enables an amplifier to deal with optical system in different system, contributing to miniaturization.

Ninth Embodiment

In the ninth embodiment, an amplifier circuit which prevents degradation of response in the case where an input signal having wider amplitude than regular signals enters the negative input terminal −IN of the first operational amplifier OP1 is described.

Figure 14:
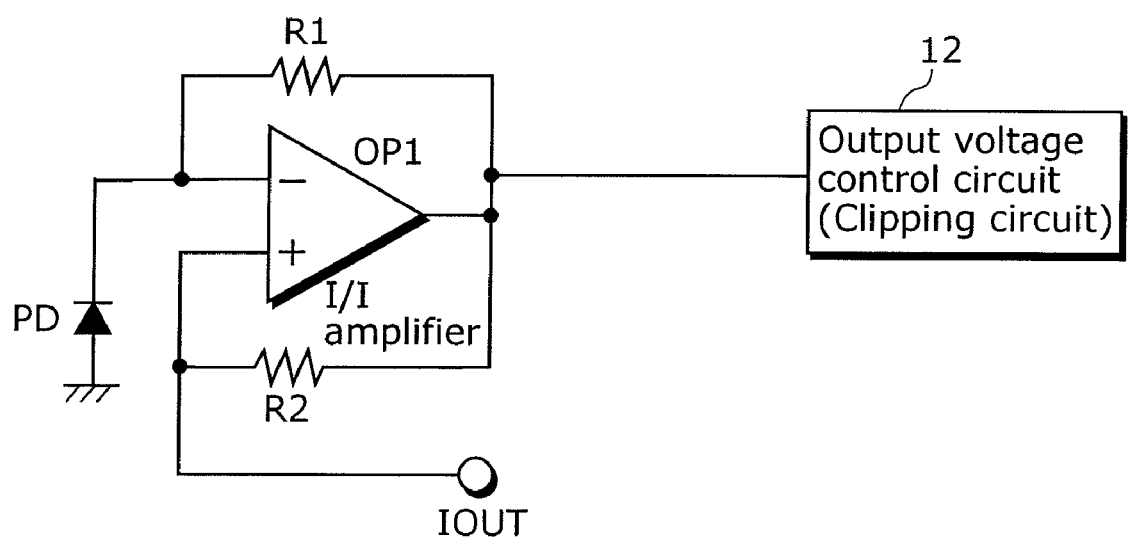
FIG. 14 is a diagram showing an amplifier circuit according to the ninth embodiment.

FIG. 14 is a diagram showing an amplifier circuit according to the ninth embodiment. FIG. 14 differs from FIG. 3 in that an output voltage control circuit 12 is added to the amplifier circuit. Since the same reference numerals are given to the same components, the descriptions for these components are omitted. Description will be made hereinafter with a focus on the difference.

The output voltage control circuit 12 is a circuit which clips current output to the maximum acceptable value of a dynamic range in the case where the current output of the first operational amplifier OP1 almost exceeds the dynamic range.

With the amplifier circuit according to the ninth embodiment, it is possible to shorten the time from the saturation of output signals in the dynamic range to return within the dynamic range. To put it differently, in the case where an input signal with wide amplitude, as wide as the dynamic range, enters the negative input terminal, saturation return time, which indicates time from the saturation of the internal circuit of the first operational amplifier to the elimination of the saturation, is prolonged. In order to prevent such an occurrence, amplitude control circuit (clipping circuit) is included so that the response is improved.

Note that a diode may be connected in parallel against the first resistor R1 instead of the output voltage control circuit 12. This diode may be conducted in the case where a breakdown voltage which is i1·R1, a voltage in which the current i1 flowing the first resistor R1 corresponds to the maximum accepted value is set as a breakdown voltage, and when the voltage exceeds the maximum accepted value.

Tenth Embodiment

In the tenth embodiment, an amplifier circuit which prevents offset voltage which could possibly be generated by the base current IB of the negative input terminal and the positive input terminal in the case where the first operational amplifier is configured with a bipolar transistor is described.

Figure 15:
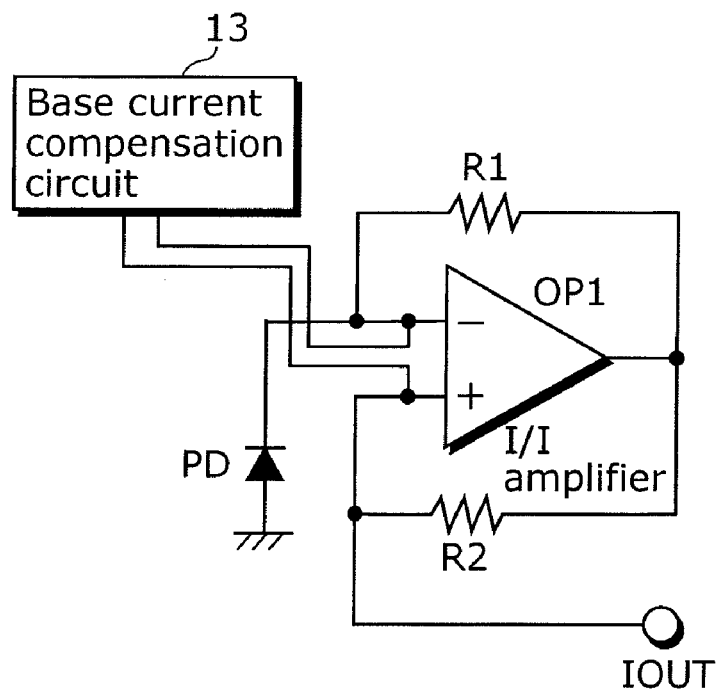
FIG. 15 is a diagram showing an amplifier circuit according to the tenth embodiment.

FIG. 15 is a diagram showing an amplifier circuit according to the tenth embodiment.

An amplifier circuit which prevents degradation of response in the case where input signal with wider amplitude enters the negative input terminal −IN of the first operational amplifier OP1 is described. FIG. 15 differs from FIG. 3 in that a base current compensation circuit 13 is added to the amplifier circuit. Since the same reference numerals are given to the same components, the descriptions for these components are omitted. Description will be made hereinafter with a focus on the difference.

The base current compensation circuit 13 is connected to the negative input terminal and the first operational amplifier and the positive input terminal of the first operational amplifier, and the base current compensation circuit 13 compensates the base current of the input transistor in the first operational amplifier. With this structure, generation of offset voltage caused by the base current can be prevented.

Eleventh Embodiment

Figure 16:
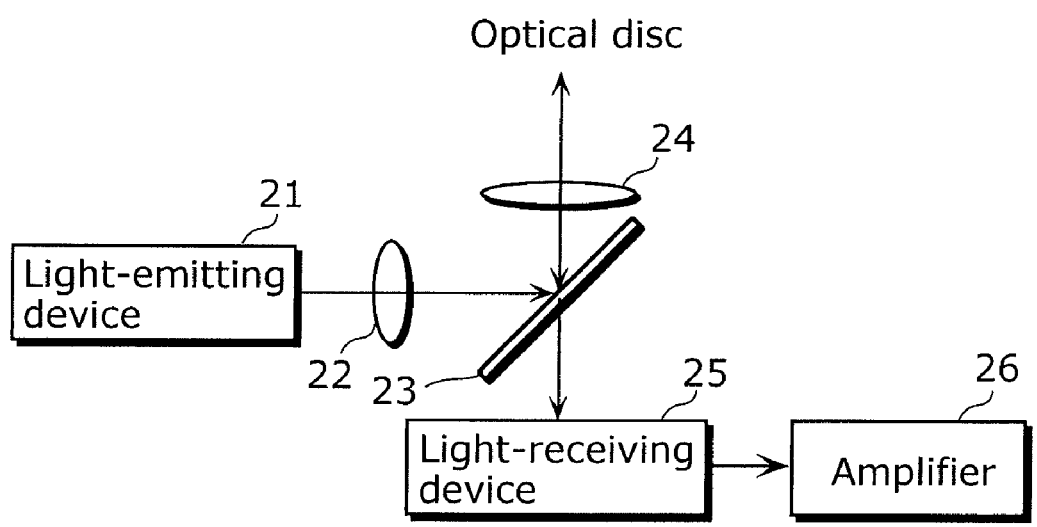
FIG. 16 is a diagram showing an amplifier circuit according to the eleventh embodiment.

FIG. 16 is a diagram showing a structure of an optical pickup device according to the eleventh embodiment.

The optical pickup device includes a light-emitting element 21, a collective lens 22, an optical element 22, an objective lens 24, a light-receiving element 25, and an amplifier 26.

The light-emitting element 21 emits laser light.

The collective lens 22 collects laser from the light-emitting element 21.

The optical element 22 is configured with dichroic filter and hologram and the like, reflects laser from the collective lens 22 to the objective lens 24, furthermore, transmits laser reflected from an optical disc, and outputs the laser to the light-receiving element 25.

The light-receiving element 25 includes one or more photodiode PD, receives laser reflected by the optical disc via the collective lens 22, and outputs a light-receiving signal.

The amplifier 26 includes amplifier circuits as many as the photodiode PD of the light-receiving element 25. The amplifier circuit may be one of the amplifier circuits respectively described in the embodiments.

Note that in each of the embodiments, the first operational amplifier may be configured with a field-effect transistor. To put it differently, by configuring the first operational amplifier with CMOS, no current flows between the negative input terminal and the positive input terminal of the first operational amplifier, and offset voltage is less likely to be generated.

Furthermore, in each of the embodiments, the first operational amplifier may be configured with a mixed process of a field-effect transistor and a bipolar transistor. For example, by configuring differential transistor of the operational amplifier with CMOS, offset voltage improves since no current flows to the negative input terminal and the positive input terminal of the first operational amplifier.

In the embodiments, plural photodiodes may be switched to any photodiode in the third SW circuit.

In the embodiments, combination which can be combined can surely be combined.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is suitable for an amplifier circuit which amplifies light-receiving signals from photodiodes, and is suitable for optical disc such as BD-ROM and BD-R, and magnetic optical disc.

What is claimed is:

1. An amplifier circuit, comprising:
 a first operational amplifier including a negative input terminal, a positive input terminal, and an output terminal;
 a photodiode connected to the negative input terminal;
 a first resistor inserted between the output terminal and the negative input terminal;
 a second resistor inserted between the output terminal and the positive input terminal; and
 a current buffer circuit to which current outputted from the output terminal of said first operational amplifier via said second resistor is inputted, wherein said first operational amplifier circuit outputs current from the output terminal via said second resistor, said current buffer circuit including a bias circuit, which sets a bias voltage to an output signal line for outputting current from the output terminal of said first operational amplifier via said second resistor.

2. The amplifier circuit of claim 1, further comprising:
 a second operational amplifier and a third resistor,
 wherein the positive input terminal of said first operational amplifier and an input terminal of said second operational amplifier are connected, and
 the third resistor is inserted between the input terminal of said second operational amplifier and an output terminal of said second operational amplifier.

3. The amplifier circuit claim 1,
 wherein said current buffer circuit has a function for amplifying current.

4. The amplifier circuit of claim 1,
 wherein said second resistor includes plural resistance elements and a second switch circuit which selectively switches one of the resistance elements to be inserted between the output terminal of said first operational amplifier and the positive input terminal of said first operational amplifier.

5. The amplifier circuit of claim 1, further Comprising:
an output voltage control circuit which prevents a voltage of the output terminal of said first operational amplifier from exceeding a predetermined voltage.

6. The amplifier circuit according to of claim 1, further comprising:
a base current compensation circuit which is connected to the negative input terminal of said first operational amplifier and the positive input terminal of said first operational amplifier, and compensates base current of input transistors in said first operational amplifier, the input transistors respectively being connected to the negative input terminal of said first operational amplifier and the positive input terminal of said first operational amplifier.

7. An amplifier circuit, comprising:
a first operational amplifier including a negative input terminal, a positive input terminal, and an output terminal;
a photodiode connected to the negative input terminal;
a first resistor inserted between the output terminal and the negative input terminal;
a second resistor inserted between the output terminal and the positive input terminal; and
a current buffer circuit to which current outputted from the output terminal of said first operational amplifier via said second resistor is inputted, wherein said first operational amplifier circuit outputs current from the output terminal via said second resistor, said first operational amplifier circuit further including plural capacitive elements for phase compensation, and the first switch circuit switches one of the capacitive elements in conjunction with the switching of the resistance element.

8. The amplifier circuit of claim 7, further comprising:
a second operational amplifier and a third resistor,
wherein the positive input terminal of said first operational amplifier and an input terminal of said second operational amplifier are connected, and
the third resistor is inserted between the input terminal of said second operational amplifier and an output terminal of said second operational amplifier.

9. The amplifier circuit of claim 7, wherein said second resistor includes plural resistance elements and a second switch circuit which selectively switches one of the resistance elements to be inserted between the output terminal of said first operational amplifier and the positive input terminal of said first operational amplifier.

10. The amplifier circuit of claim 7, further comprising:
an output voltage control circuit which prevents a voltage of the output terminal of said first operational amplifier from exceeding a predetermined voltage.

11. The amplifier circuit of claim 7, further comprising:
a base current compensation circuit which is connected to the negative input terminal of said first operational amplifier and the positive input terminal of said first operational amplifier, and compensates base current of input transistors in said first operational amplifier, the input transistors respectively being connected to the negative input terminal of said first operational amplifier and the positive input terminal of said first operational amplifier.

* * * * *